(12) United States Patent
Winger

(10) Patent No.: US 7,469,070 B2
(45) Date of Patent: Dec. 23, 2008

(54) METHOD FOR SELECTION OF CONTEXTS FOR ARITHMETIC CODING OF REFERENCE PICTURE AND MOTION VECTOR RESIDUAL BITSTREAM SYNTAX ELEMENTS

(75) Inventor: Lowell L. Winger, Waterloo (CA)

(73) Assignee: LSI Corporation, Milpitas, CA (US)

( * ) Notice: Subject to any disclaimer, the term of this patent is extended or adjusted under 35 U.S.C. 154(b) by 891 days.

(21) Appl. No.: 10/774,913

(22) Filed: Feb. 9, 2004

(65) Prior Publication Data

US 2005/0179572 A1   Aug. 18, 2005

(51) Int. Cl.
G06K 9/36 (2006.01)
G06K 6/46 (2006.01)

(52) U.S. Cl. ...................... 382/239; 382/247

(58) Field of Classification Search ............... 382/239, 382/247; 341/107
See application file for complete search history.

(56) References Cited

U.S. PATENT DOCUMENTS 6,236,960 B1    5/2001  Peng et al.
2005/0074176 A1* 4/2005  Marpe et al. ............ 382/239

OTHER PUBLICATIONS

Wiegand et al., Draft ITU-T Recommendation and Final Draft International Standard of Joint Video Specification (ITU-T Rec. H.264 | ISO/IEC 14496-10 AVC), May 29, 2003.

Wiegand et al., Draft ITU-T Recommendation and Final Draft International Standard of Joint Video Specification (ITU-T Rec. H.264 | ISO/IEC 14496-10 AVC), Apr. 2, 2003.

Thomas Wiegand, Editor's Proposed Draft Text Modification for Joint Video Specification (ITU-T Rec. H.264 | ISO/IEC 14496-10 AVC), Draft 7, Sep. 19, 2002.

Wiegand et al., Draft ITU-T Recommendation and Final Draft International Standard of Joint Video Specification (ITU-T Rec. H.265 | ISO/IEC 14496-10 AVC), May 29, 2003.

Wiegand et al., Draft ITU-T Recommendation and Final Draft International Standard of Joint Video Specification (ITU-T Rec. H.265 | ISO/IEC 14496-10 AVC), Apr. 2, 2003.

Thomas Wiegand, Editor's Proposed Draft Text Modification for Joint Video Specification (ITU-T Rec. H.265 | ISO/IEC 14496-10 AVC), Draft 7, Sep. 19, 2002.

* cited by examiner

Primary Examiner—Matthew C Bella
Assistant Examiner—John Strege
(74) Attorney, Agent, or Firm—Christopher P. Maiorana, PC

(57) ABSTRACT

A method for determining a context for coding is disclosed. The method generally includes the steps of (A) generating a plurality of results by examining a prediction mode for each of a plurality of neighbor blocks to a current block in a bitstream for digital video, wherein at least one of the neighbor blocks is subpartitioned, (B) generating a plurality of first variables based on the results and (C) coding the bitstream using a binary arithmetic coding based on a particular context among a plurality of context determined from the first variables.

20 Claims, 5 Drawing Sheets

METHOD FOR SELECTION OF CONTEXTS FOR ARITHMETIC CODING OF REFERENCE PICTURE AND MOTION VECTOR RESIDUAL BITSTREAM SYNTAX ELEMENTS

FIELD OF THE INVENTION

The present invention relates to digital video coding generally and, more particularly, to a method for selection of contexts for arithmetic coding of reference picture and motion vector residual bitstream syntax elements.

BACKGROUND OF THE INVENTION

Several conventional approaches exist for collecting context for context adaptive binary arithmetic coding (CABAC) for use in digital video encoding and decoding. A first conventional approach is a public software implementation, referred to as the "JM software version 6.2", available from a Joint Video Team (JVT) of the International Organization for Standardization/International Electrotechnical Commission (ISO/IEC) MPEG and the Video Coding Expert Group (VCEG) of the International Telecommunications Union-Telecommunications Standardization Sector (ITU-T). A second conventional approach is a document "Draft ITU-T Recommendation and Final Draft International Standard of Joint Video Specification (ITU-T Rec. H.264 | ISO/IEC 14496-10 AVC)", document number JVT-G050r1, also available from the JVT, referred to as the "JVT-G050r1 document". Both approaches could be more efficient when dealing with subpartitioned macroblocks neighboring a current macroblock being considered.

The following code indicates a relevant portion of a method implemented by the JM software version 6.2:

```
if((img -> subblock_y ==0) && ((currMB -> mb_available
[0] [1] ==
NULL) || (IS_DIRECT(currMB -> mb_available[0] [1]))))
    b = 0;
else
    b = (refframe_array[block_y+img -> subblock_y-1] [img ->
block_x+img -> subblock_x] > 0? 1 : 0);
if ((img -> subblock_x ==0) && ((currMB -> mb_available
[1] [0] ==
NULL) || (IS_DIRECT(currMB -> mb_available[1] [0]))))
    a = 0;
else
    a = (refframe_array[block_y+img -> subblock_y] [img ->
block_x+img -> subblock_x-1] > 0? 1 : 0);
act_ctx = a + 2*b;
```

The JM software version 6.2 is problematic because the JM software does not check if a neighboring 8×8 sub-macroblock of a subpartitioned macroblock is skipped or direct before calculating the context for the current macroblock/sub-macroblock. Not checking the mode of the neighboring 8×8 sub-macroblock undesirably leads to having a compliant decoder derive reference indices and/or motion vectors for direct-mode or skipped neighbors in order to CABAC parse the syntax elements for the current macroblock/sub-macroblock. In most pipelined designs, the derived results would not be available at the time of the current parsing, causing a pipeline stall. For some specialized architectures that attempt to do CABAC parsing completely separately from the rest of the decoding process, the JM software version 6.2 approach would mean having to replicate a complex decoding process for direct-mode prediction of reference indices and motion vectors in a CABAC parsing engine.

The JVT-G050r1 document approach is suboptimal. Unlike the JM software version 6.2 approach, for all cases in which the neighboring macroblock is subpartitioned into 8×8 subpartitions (i.e., P_8×8 or B_8×8 macroblock modes), the JVT-G050r1 document does not consider reference index or motion vector information from the neighboring sub-macroblock (i.e., whether it uses pixel predictions from reference picture list 0 and/or reference picture list 1) when determining the context to be used for CABAC coding of current reference indices and/or motion vectors. Excluding the prediction information from subpartitioned neighboring macroblocks is good in that the implementation problem of the JM software method is solved. However, the exclusion introduces a new suboptimality not present in the JM software version 6.2 in that no consideration is given to whether the neighboring sub-macroblock is using a list 0 or a list 1 motion-vector/reference-index when the current motion-vector/reference-index is coded.

A result is that even though additional contextual information is easily (i.e., without excessive complexity) available when neighboring 8×8 sub-partitions are not predicted using direct-mode or skip, the information is not used. In cases where the additional information could potentially help improve the conditional probability estimates used by the CABAC model for coding the current motion-vector/reference-index, coding efficiency will be decreased. In a preferred approach, motion-vector and reference indices of neighboring 8×8 sub-partitions that are neither skipped nor inferred through direct-mode prediction may be used to select the contexts used for coding the current motion-vectors and/or reference indices.

SUMMARY OF THE INVENTION

The present invention concerns a method for determining a context for coding. The method generally comprises the steps of (A) generating a plurality of results by examining a prediction mode for each of a plurality of neighbor blocks to a current block in a bitstream for digital video, wherein at least one of the neighbor blocks is subpartitioned, (B) generating a plurality of first variables based on the results and (C) coding the bitstream using a binary arithmetic coding based on a particular context among a plurality of context determined from the first variables.

The objects, features and advantages of the present invention include providing an apparatus and/or method for determining a context for coding that may (i) achieve a high possible compression with context adaptive binary arithmetic encoding (CABAC), (ii) properly lump symbols with similar context-relative probabilities of occurrence together into the same contexts, (iii) permit faster and more accurate adaptation of the contexts to match underlying probabilities of a symbol source (e.g., compressed video syntax), (iv) lead to an reduction in an average bitrate for most sources, (v) provide a low complexity decoding processes and/or (vi) reduce tightly coupled input from previous/adjacent macroblocks back to a CABAC decoding engine as compared with conventional approaches.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
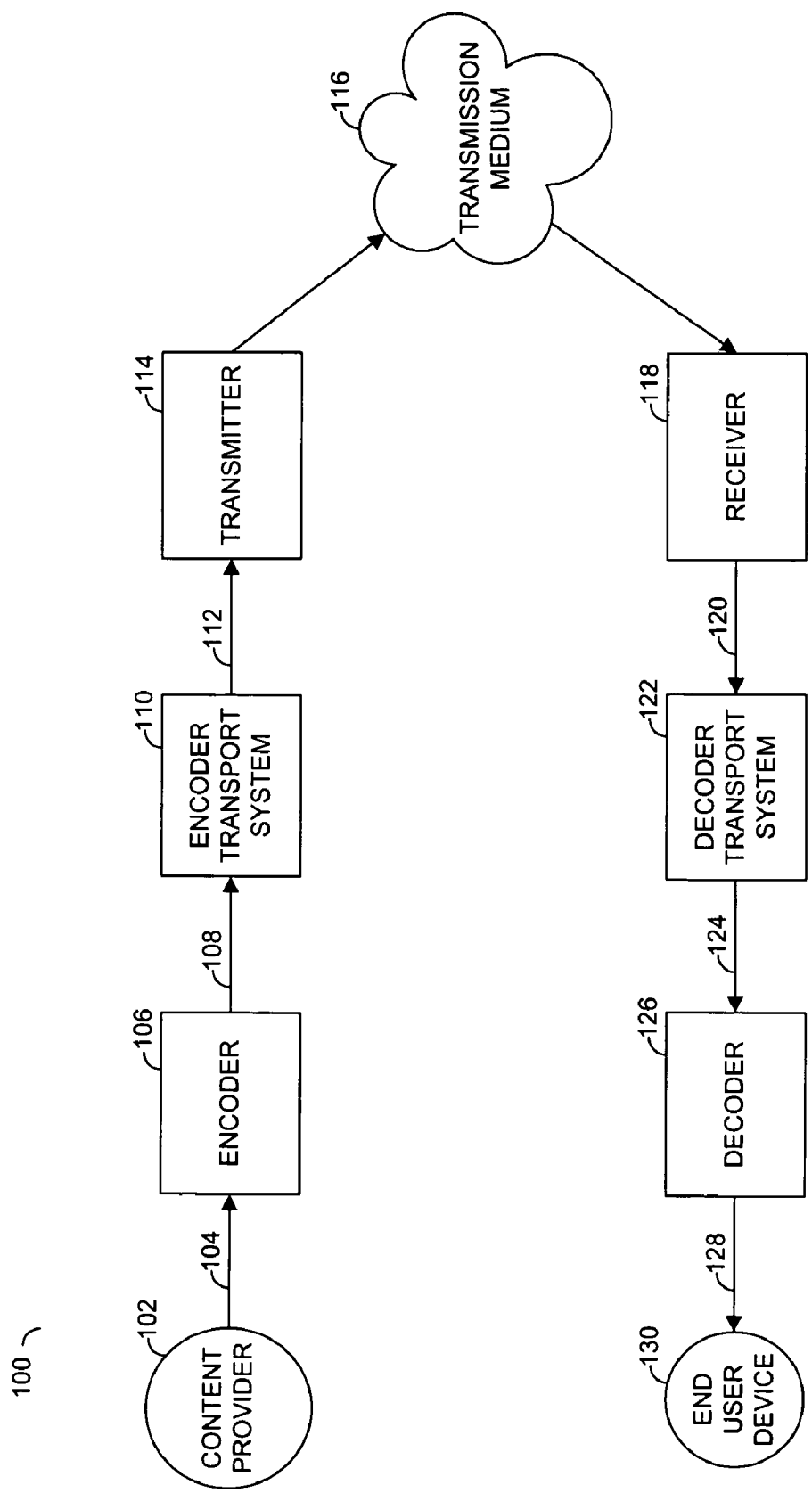
FIG. 1 is a block diagram of a system implementing the present invention.

Referring to FIG. 1, a block diagram of a system 100 is shown. In general, a content provider 102 presents video image, audio or other data 104 to be compressed and transmitted to an input of an encoder 106. The compressed data 108 from the encoder 106 may be presented to an encoder transport system 110. An output of the encoder transport system 110 generally presents a signal 112 to a transmitter 114. The transmitter 114 transmits the compressed data via a transmission medium 116. The content provider 102 may comprise a video broadcast, DVD, or any other source of video data stream. The transmission medium 116 may comprise a broadcast, cable, satellite, network, DVD, hard drive, or any other medium implemented to carry, transfer, and/or store a compressed bitstream.

On a receiving side of the system 100, a receiver 118 generally receives the compressed data bitstream from the transmission medium 116. The receiver 118 presents a bitstream 120 to a decoder transport system 122. The decoder transport system 122 generally presents the bitstream via a link 124 to a decoder 126. The decoder 126 generally decompresses the data bitstream and presents the data via a link 128 to an end user device 130. The end user device 130 may comprise a television, monitor, computer, projector, hard drive, or any other medium implemented to carry, transfer, present, display and/or store an uncompressed bitstream.

An encoding process performed by the encoder 106 may be implemented as a context adaptive binary arithmetic coding (CABAC) process. A decoding process performed by the decoder 126 may also be implemented as CABAC process in a reverse transformation as the encoding. Hereafter, the term "coding" may generally refer to encoding and/or decoding. Additional details regarding the CABAC coding and related context may be found in the document "Draft ITU-T Recommendation and Final Draft International Standard of Joint Video Specification (ITU-T Rec. H.264 | ISO/IEC 14496-10 AVC)", document number JVT-G050r1, published by the Joint Video Team (JVT) of the International Organization for Standardization/International Electrotechnical Commission (ISO/IEC) MPEG and the Video Coding Expert Group (VCEG) of the International Telecommunications Union-Telecommunications Standardization Sector (ITU-T), May, 2003, Geneva, Switzerland which is hereby incorporated by reference in its entirety. Other methods of coding may be implemented to meet the criteria of a particular application. Hereafter, the ISO/IEC 14496-10 standard and the ITU-T recommendation H.264 may be generally referred to as an "H.264/MPEG4-AVC standard".

Figure 2:
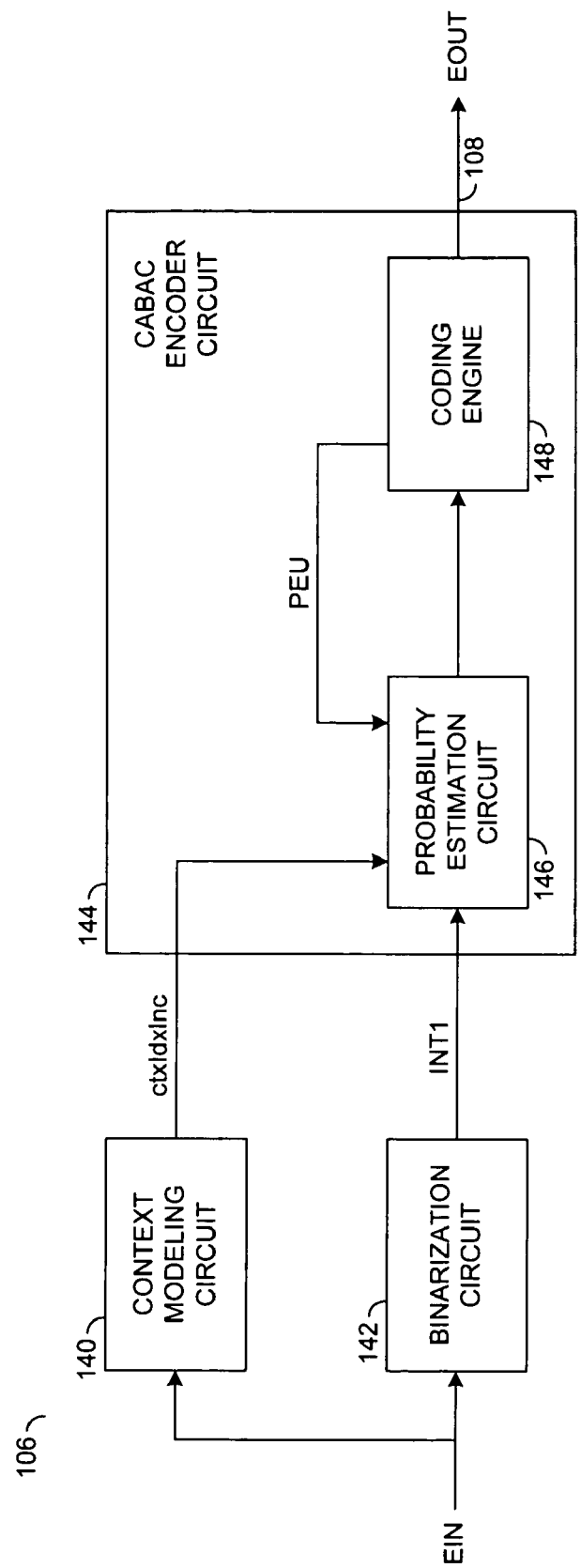
FIG. 2 is a partial block diagram of an example implementation for an encoder in accordance with a preferred embodiment of the present invention.

Referring to FIG. 2, a partial block diagram of an example implementation for the encoder 106 is shown in accordance with a preferred embodiment of the present invention. The encoder (or system) 106 generally comprises a circuit (or module) 140, a circuit (or module) 142 and a circuit (or module) 144. A signal (e.g., EIN) may be received by the encoder 106. A signal (e.g., EOUT) may be generated by the encoder to carry the compressed data.

The circuit 140 may be referred to as a context modeling circuit. The context modeling circuit 140 may be configured to generate a context variable carried in a signal or variable (e.g., ctxIdxInc) for use in encoding by performing a context modeling of the signal EIN. The signal EIN may carry multiple syntax elements to be encoded. The signal ctxIdxInc may convey a variable set by context index increments information.

The circuit 142 may be referred to as a binarization circuit. The binarization circuit 142 may be configured to perform a binarization operation on the signal EIN to generate an intermediate signal (e.g., INT1). The circuit 144 may be referred to as a context adaptive binary arithmetic coding (CABAC) circuit. The CABAC encoding circuit 144 may be configured to perform a context adaptive binary arithmetic coding of the signal INT1 based on the signal ctxIdxInc.

The CABAC encoding circuit 144 generally comprises a circuit (or module) 146 and a circuit (or module) 148. The circuit 146 may be referred to as a probability estimation circuit. The probability estimation circuit 146 may be configured to present a particular context among multiple context available to the circuit 148 based upon the signal ctxIdxInc. The circuit 148 may be referred to as a coding engine. The coding engine 148 may encode the signal INT1 using the particular context to generate the compressed data 108. The coding engine 148 may also generate a signal (e.g., PEU) back to the probability estimation circuit 146. The signal PEU may carry probability estimation update information to allow for adaptation over time to changing context.

Figure 3:
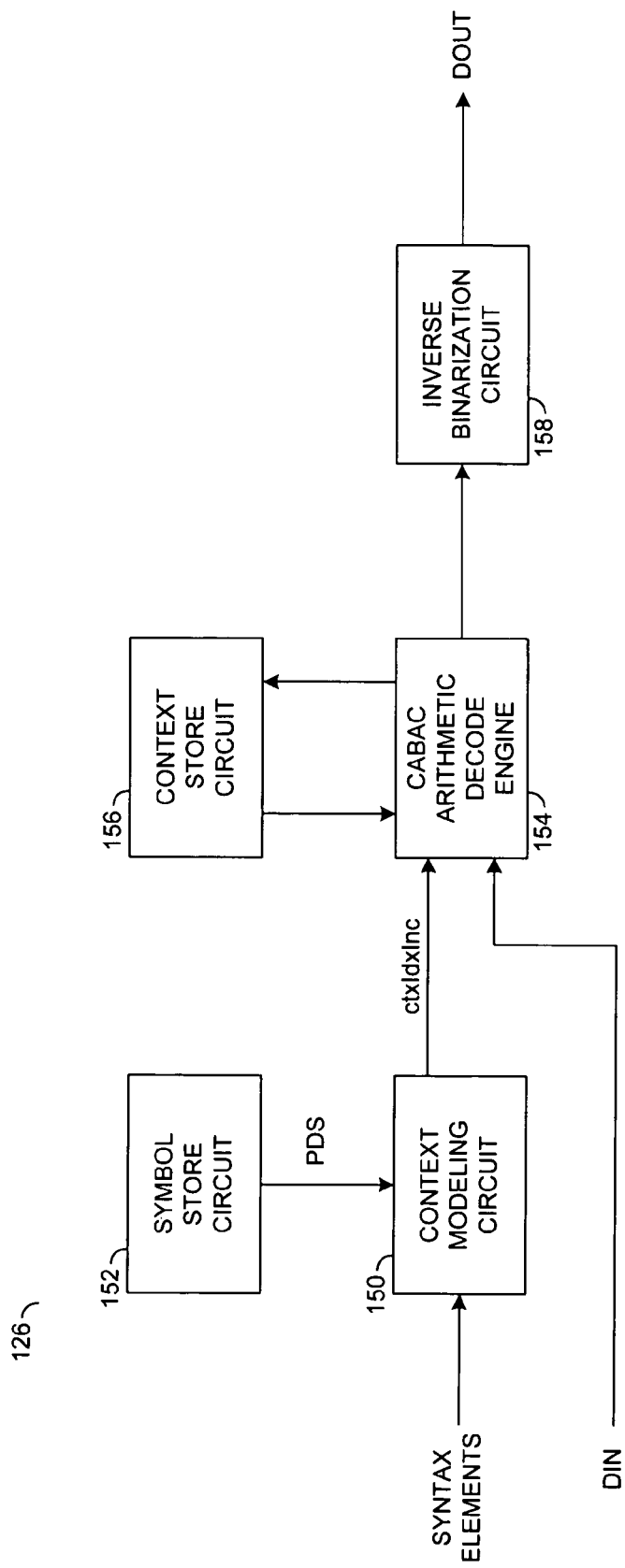
FIG. 3 is a partial block diagram for an example implementation of a decoder in accordance with a preferred embodiment of the present invention.

Referring to FIG. 3, a partial block diagram for an example implementation of the decoder 126 is shown in accordance with a preferred embodiment of the present invention. The decoder (or system) 126 generally comprises a circuit (or module) 150, a circuit (or module) 152, a circuit (or module) 154, a circuit (or module) 156 and a circuit (or module) 158. The decoder 126 may receive the bitstream via the link 124. The decoder 126 may present a signal (e.g., DOUT). The signal DOUT may carry a sequence of decoded symbols used in decoding reference picture, motion vector residuals and the like.

The circuit 150 may be referred to as another context modeling circuit. The context modeling circuit 150 may be configured to generate a second signal ctxIdxInc for use in decoding the symbols. The signal ctxIdxInc may be presented to the circuit 154.

The circuit 154 may be referred to as a CABAC arithmetic decoding engine. The CABAC arithmetic decoding engine 154 may be configured to perform a CABAC decoding operation on the signal DIN based on the context identified in the signal ctxIdxInc. The circuit 152 may be referred to as a symbol store circuit. The symbol store circuit 152 may be configured to provide storage for previously decoded symbols for use by the context modeling circuit 150. The circuit 156 may be referred to as a context store circuit. The context store circuit 156 may be configured to provide storage for contexts in use by the CABAC arithmetic decoding engine 154.

The circuit 158 may be referred to as an inverse binarization circuit. The inverse binarization circuit 158 may be configured to undo the binarization operation performed by the binarization circuit 142 (FIG. 2) in the encoder 106. The inverse binarization circuit 158 may generate the signal DOUT.

Figure 4:
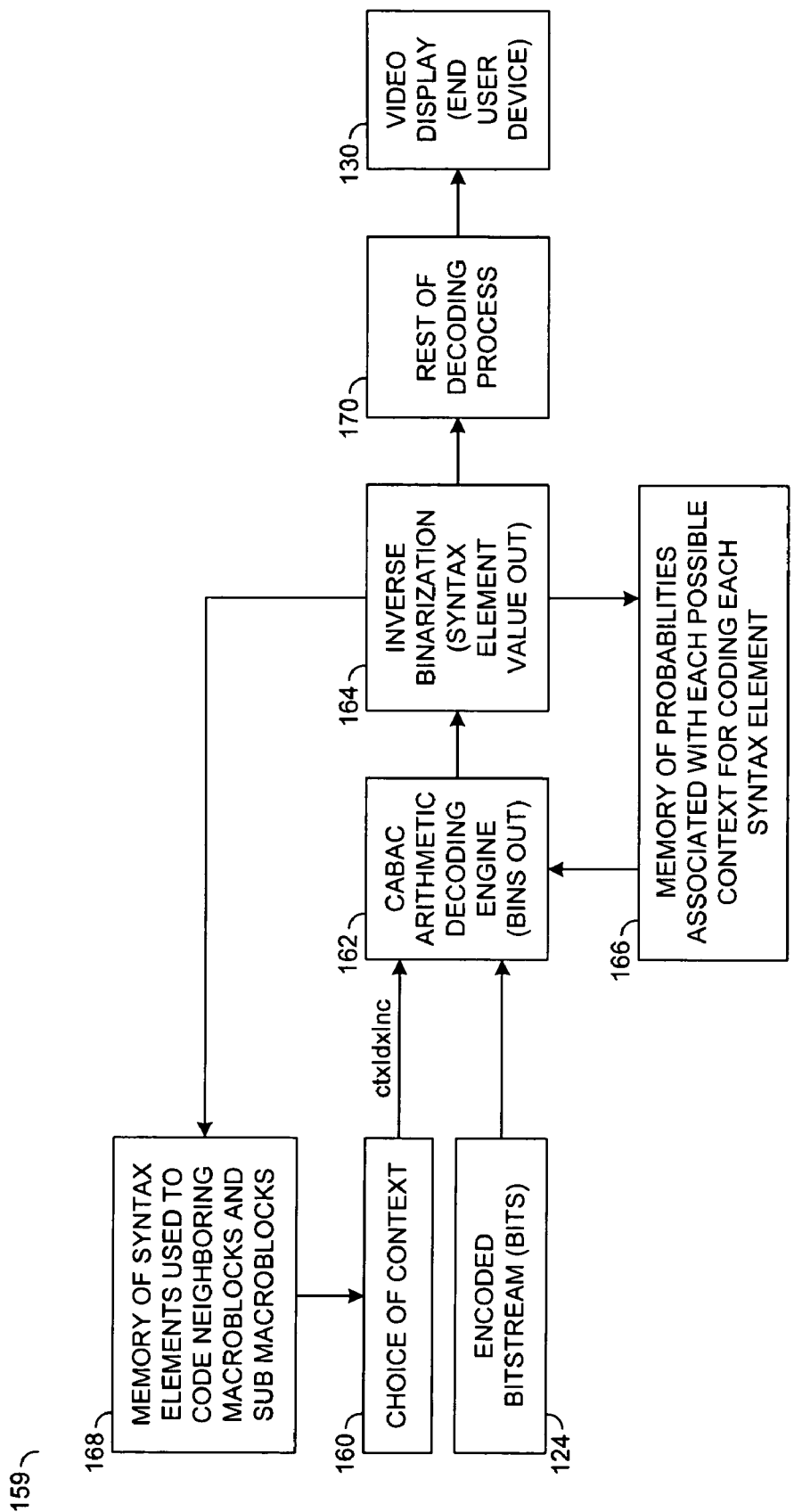
FIG. 4 is a partial functional block diagram for an example implementation of a decoding operation.

Referring to FIG. 4, a partial functional block diagram for an example implementation of a decoding operation 159 is shown. The operation generally comprises a function (or process) 160, a function (or process) 162, a function (or process) 164, a function (or process) 166, a function (or process) 168 and a function (or process) 170. The decoding operation 159 may receive the bitstream from the link 124. The end user device 130 may receive the final decoded video and/or audio information.

The function 160 (e.g., allocated to the context modeling circuit 150) may operate to provide choice of context in the signal ctxIdxInc for decoding of a current syntax element. The context choice is generally based on prior decoded information stored in the function 168 (e.g., allocated to the symbol store circuit 152). The context may be effective if syntax elements with similar probabilities have been grouped together. For example, a syntax element representing a reference index (e.g., indicating which of multiple reference pictures was used for temporal prediction) might use a single context if neighboring macroblocks, sub-macroblocks or blocks use both an index 0 (e.g., presumed to be a most recent or most likely reference picture) and a different context if one of more of the neighbors uses a different reference picture. Since reference pictures may be listed in either a list 0 or a list 1 independently, a best context selection may properly identify how likely the neighbor is to actually be the same or a different picture. In contrast, the JVT-G050r1 document does not generate a proper identification when the neighbor is an 8×8 sub-macroblock of a partitioned macroblock that uses "inter" prediction, but neither "skip" nor "direct-mode" prediction.

The function 162 (e.g., allocated to the CABAC arithmetic decoding engine 154) may operate to provide decoding of the encoded bitstream to present data in bins. The function 164 (e.g., allocated to the inverse binarization circuit 158) may operate on the bins to generate values for various syntax elements, image data, motion compensation data and the like. The inverse binarization function 164 may also generate probabilities associated with each possible context for coding each syntax element. The probabilities may be stored by the function 166 (e.g., allocated to the context store circuit 156) for subsequent use by the decoding function 162. The inverse binarization function 164 may also generate decoded syntax elements which may provided to the rest of the decoding process (e.g., function 170) and back to the function 168. The function 168 (e.g., allocated to the symbols store circuit 152) may buffer the symbols or syntax elements for subsequent use by the choice of context function 160 generally used to code neighboring macroblock and sub-macroblocks. The function 170 may complete the decoding process to present video and/or audio information to the end user device 130 (e.g., a video display).

Figure 5:
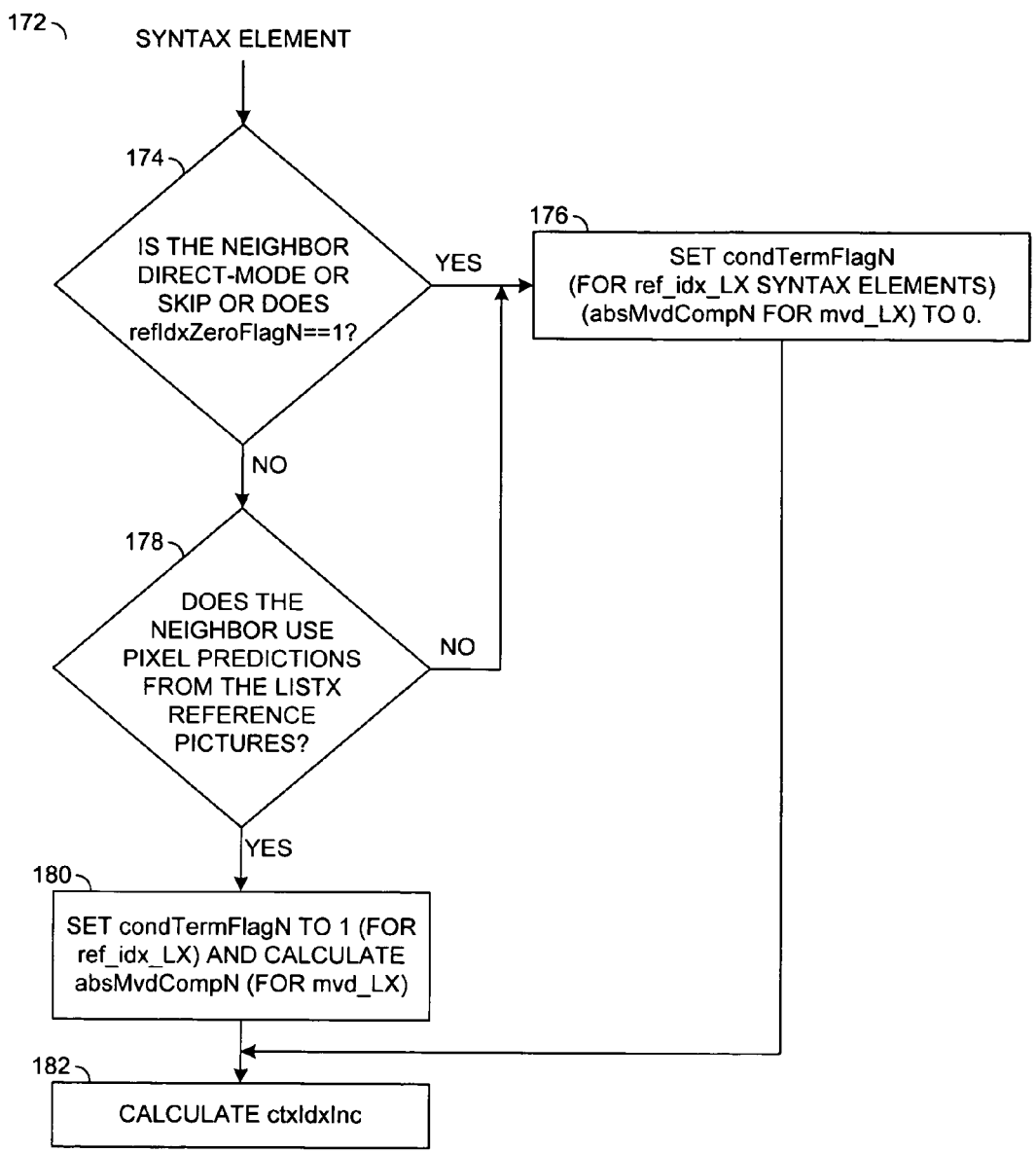
FIG. 5 is a partial flow diagram of an example implementation of a process for deriving context index increments.

Referring to FIG. 5, a partial flow diagram of an example implementation of a process (or method) 172 for deriving context index increments. The process 172 generally comprises a step 174, a step 176, a step 178, a step 180 and a step 182. The process 172 may receive syntax elements as an input. A value for the signal ctxIdxInc may be generated by the process 172. A context index increment is generally an increment into an indexed/ordered list of contexts.

The step 174 may determine if each of multiple neighbor macroblocks, sub-macroblocks or blocks (e.g., a neighbor A to the left of a current block C and a neighbor B above the current block C) have a direct mode or a skip mode or if a reference index zero flag (e.g., refIdxZeroFlagN, where N may be either neighbor A or B) is set to a particular state (e.g., a logical "one" state). If any of the above conditions are true (e.g., the YES branch of step 174), a corresponding condition term flag variable (e.g., condTermFlagN, where N may be either neighbor A or B) or an absolute motion vector different component variable (e.g., absMvdCompN, where N may be either neighbor A or B) may be set to a zero condition of a logical "zero" state by step 176. If none of the above conditions are true (e.g., the NO branch of step 174), additional check may be made by step 178.

Step 178 may determine if the neighbors A and/or B use pixel predictions from the list 0 or list 1 reference pictures. If neither a list 0 and a list 1 reference picture is used for pixel predictions (e.g., the NO branch of step 178), step 176 may set the appropriate variable condTermFlagN or absMvdCompN to the zero condition. If one or both of a list 0 and a list 1 reference pictures are used for pixel predictions (e.g., the YES branch of step 178), step 180 operating on a reference index list syntax element (e.g., ref_idx_LX, where X may be either 0 or 1) may set the corresponding variable condTermFlagN to a non-zero condition or a logical "one" state (e.g., condTermFlag0=1 if a list 0 reference picture is used and condTermFlag1=1 if a list 1 reference picture is used). Step 180 operating on a motion vector difference list syntax element (e.g., mvd_LX, where X may be either 0 or 1) may calculate a non-zero value (condition) for the corresponding variable absMvdCompN. Step 182 may calculate the signal ctxIdxInc from either (i) both condTermFlagA and condTermFlagB or (ii) both absMvdCompA and absMvdCompB.

Details for the process 172 to derive the signal ctxIdxInc for the syntax elements ref_idx_L0 and ref_idx_L1 may be explained below. Inputs to the process 172 may include a macroblock partition index variable (e.g., mbPartIdx) and the reference picture list suffix "LX", where X may be either 0 or 1. An output of the process 172 may be the signal ctxIdxInc. A derivation process for neighboring partitions specified in a subclause 6.4.7.5 of the JVT-G050r1 document may be invoked with variable mbPartIdx and a sub-macroblock partition index variable (e.g., subMbPartIdx) set to zero as inputs and the output is assigned to two macroblock address\macroblock partition index variables (e.g., mbAddrA\mbPartIdxA and mbAddrB\mbPartIdxB).

With syntax elements ref_idx_LX[mbPartIdxN] (where N may be either A or B) specifying the syntax element for the macroblock address mbAddrN, the variable refIdxZeroFlagN may be derived as follows:

(1) If a macroblock adaptive field frame flag (e.g., MbaffFrameFlag) is equal to 1, the current macroblock is a frame macroblock and the macroblock mbAddrN is a field macroblock, reference index zero flag (e.g., refIdxZeroFlagN)=(( ref_idx_LX[mbPartIdxN]>1)?0:1.

(2) Otherwise, refIdxZeroFlagN=((ref_idx_LX[mbPartIdxN]>0)?0:1.

A predictor mode equal flag (e.g., predModeEqualFlag) may be specified as follows:

(1) If the macroblock mbAddrN has a macroblock type (e.g., mb_type) equal to P_8×8 or B_8×8, the following applies
  (i) If a sub-macroblock predictor mode (e.g., subMbPredMode(sub_mb_type[mbPartIdxN])) is not equal to Pred_LX and not equal to BiPred,
    predModeEqualFlag is set equal to 0, where sub_mb_type specifies the syntax element for the macroblock mbAddrN.
  (ii) Otherwise,
    predModeEqualFlag is set equal to 1.

(2) Otherwise, the following applies
  (i) If MbPartPredMode(mb_type, mbPartIdxN) is not equal to Pred_LX and not equal to BiPred, predModeEqualFlag is set equal to 0, where mb_type specifies the syntax element for the macroblock mbAddrN.

(ii) Otherwise, predModeEqualFlag is set equal to 1.

The variable condTermFlagN may be derived as follows:

(1) If any of the following conditions is true, condTermFlagN is set equal to 0
  (i) mbAddrN is not available,
  (ii) the macroblock mbAddrN has mb_type equal to P_Skip or B_Skip,
  (iii) the macroblock mbAddrN is coded in Intra prediction mode,
  (iv) predModeEqualFlag is equal to 0,
  (v) refIdxZeroFlagN is equal to 1.

(2) Otherwise,
  condTermFlagN is set equal to 1.

The variable ctxIdxInc may be derived as:

ctxIdxInc=condTermFlagA+2*condTermFlagB

Four different values for variable ctxIdxInc (e.g., 0, 1, 2, 3) indicating the four different contexts (e.g., pools of statistical information) that may be used for encoding syntax elements ref_idx_L0 and ref_idx_L1. The variable condTermFlagN may be set to a non-zero condition (e.g., a logical one state) upon concluding that the neighbouring values of the syntax elements ref_idx_L0 and ref_idx_L1 may be more significant in trying to predict, in terms of conditional probability and therefore efficient entropy coding, the current values. For example, the variable ctxIdxInc being three generally indicates a conclusion that the correlation of syntax elements with both neighbours may be very significant and should be used as conditional information when entropy encoding. Similarly, the variable ctxIdxInc being zero generally indicates a conclusion that the correlation of syntax elements with the values of both neighbours may be very insignificant (e.g., likely that no correlation exists). Values of the variable ctxIdxInc between zero and three may indicate intermediate levels of significance. By having separate contexts (e.g., pools of statistical history) for different levels of confidence based on "contextual" (e.g., neighbouring previously encoded) information for the current syntax element, coding efficiency may be increased in agreement with a principal behind CABAC entropy coding. The present invention generally establishes a best method to set the value of the variable condTermFlagN for both encoding and decoding related to the reference indices syntax elements ref_idx_LX and the motion vector difference syntax elements mvd_LX.

Details for the process 172 to derive the variable ctxIdxInc for the syntax elements mvd_L0 and mvd_L1 is generally described below. Inputs to the process 172 may include a macroblock partition index variable (e.g., mbPartIdx), a sub-macroblock partition index variable (e.g., subMbPartIdx), the reference picture list suffix LX and a context index offset variable (e.g., ctxIdxOffset). An output of the process 172 may be the variable ctxIdxInc. A derivation process for neighboring partitions specified in subclause 6.4.7.5 of the JVT-G050r1 document may be invoked with the variable mbPartIdx and the variable subMbPartIdx as inputs and the output may be assigned to mbAddrA\mbPartIdxA\subMbPartIdxA and mbAddrB\mbPartIdxB\subMbPartIdxB.

The variable compIdx may be derived as follows:

(1) If ctxIdxOffset is equal to 40, compIdx is set equal to 0.
(2) Otherwise, (ctxIdxOffset is equal to 47), compIdx is set equal to 1.

The variable predModeEqualFlag may be specified as follows:

(1) If the macroblock mbAddrN has mb_type equal to P_8×8 or B_8×8, the following applies
  (i) If subMbPredMode(sub_mb_type[mbPartIdxN]) is not equal to Pred_LX and not equal to BiPred, predModeEqualFlag is set equal to 0, where sub_mb_type specifies the syntax element for the macroblock mbAddrN,
  (ii) Otherwise, predModeEqualFlag is set equal to 1.

(2) Otherwise, the following applies
  (i) If MbPartPredMode(mb_type, mbPartIdxN) is not equal to Pred_LX and not equal to BiPred, predModeEqualFlag is set equal to 0, where mb_type specifies the syntax element for the macroblock mbAddrN,
  (ii) Otherwise, predModeEqualFlag is set equal to 1.

The variable absMvdCompN (where N may be either A or B) may be derived as follows:

(1) If any of the following conditions is true, absMvdCompN is set equal to 0
  (i) mbAddrN is not available,
  (ii) the macroblock mbAddrN has mb_type equal to P_Skip or B_Skip,
  (iii) the macroblock mbAddrN is coded in Intra prediction mode,
  (iv) predModeEqualFlag is equal to 0.

(2) Otherwise, the following applies
  (i) If compIdx is equal to 1, MbaffFrameFlag is equal to 1, the current macroblock is a frame macroblock and the macroblock mbAddrN is a field macroblock,
    absMvdCompN=Abs(mvd_LX[mbPartIdxN][subMbPartIdxN][compIdx])*2
  (ii) Otherwise, if compIdx is equal to 1, MbaffFrameFlag is equal to 1, the current macroblock is a field macroblock and the macroblock mbAddrN is a frame macroblock
    absMvdCompN=Abs(mvd_LX[mbPartIdxN][subMbPartIdxN][compIdx])/2
  (iii) Otherwise,
    absMvdCompN=Abs(mvd_LX[mbPartIdxN][subMbPartIdxN][compIdx]

The variable ctxIdxInc may be derived as follows:

(1) If (absMvdCompN absMvdCompB) is less than 3, ctxIdxInc is set equal to 0.
(2) Otherwise, if (absMvdCompA+absMvdCompB) is greater than 32, ctxIdxInc is set equal to 2.
(3) Otherwise, ((absMvdCompA+absMvdCompB) is in the range of 3 to 32, inclusive), ctxIdxInc is set equal to 1.

If the neighboring macroblock is using subpartitioning (e.g., 8×8 sub-macroblocks), the prediction mode list 0 or list 1 of the neighboring partition may be explicitly compared with the prediction mode Pred_LX of the current macroblock and, only if the neighbor uses prediction from the same list as the current list information being encoded, may the values of the reference indices and motion vector residuals be considered in determining the contexts for the current encoding. For example, if subMbPredMode sub_mb_type[mbPartIdxN]) is not equal to Pred_LX and not equal to BiPred, predModeEqualFlag may be set equal to 0, where sub_mb_type specifies the syntax element for the macroblock mbAddrN. The conventional approaches do not account for the above comparison.

The present invention may simultaneously achieve a much simpler implementation of CABAC coding, that may be particularly useful for a realtime implementation of CABAC decoding and a high possible compression efficiency. The present invention has been generally described in terms of the H.264/MPEG4-AVC standard defining a method for implementation by compliant decoders and by encoders that produce compliant bitstreams. The present invention may apply particularly to all bitstreams that make use of 8×8 subpartitioning of macroblocks and CABAC coding. Furthermore, the present invention generally makes a determination for a value of the variable condTermFlagN possible based on the use, or failure to use Pred_L0 or Pred_L1 predictions from each 8×8 block, along with separate handling for all direct-mode predictions. In contrast, the conventional approaches do not take into account subpartitioned macroblocks Pred_L0 and Pred_L1 values for the neighbours. A hardware implementation in accordance with the present invention may be simpler than with the conventional approaches since for lack of a special case to ignore the Pred_L0, Pred_L1 prediction flag information for the specific cases of P_8×8 and B_8×8 subpartitioned macroblocks.

The function performed by the flow diagrams of FIGS. 4 and 5 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for determining a context for coding, comprising the steps of:
   (A) evaluating a neighbor condition corresponding to a plurality of neighbor blocks to a current block in a bitstream of digital video, wherein (1) said neighbor condition comprises (i) a first of said neighbor blocks having an unavailable macroblock address, (ii) a second of said neighbor blocks having an intra-prediction mode of a plurality of prediction modes, (iii) a third of said neighbor blocks having a skip mode of said prediction modes and (iv) a reference index zero flag having a non-zero condition and (v) a prediction mode flag having a zero condition and (2) said prediction mode flag has said zero condition where (i) a fourth of said neighbor blocks is sub-partitioned and has a sub-macroblock prediction mode that is not an inter-prediction mode of said prediction modes and not a bi-directional prediction mode of said prediction modes and (ii) a fifth of said neighbor blocks is unpartitioned and has a macroblock partition prediction mode that is not said inter-prediction mode and not said bi-directional prediction mode;
   (B) generating a plurality of first variables based on said neighbor condition;
   (C) calculating a context index increment variable based on said first variables; and
   (D) coding said bitstream using a binary arithmetic coding based on a particular context among a plurality of context determined from said context index increment variable.

2. The method according to claim 1, wherein said context index increment variable is based on a sum of two of said first variables.

3. The method according to claim 1, wherein step (B) comprises the sub-step of:
   independently setting each of said first variables to said non-zero condition in response to said neighbor condition indicating that a corresponding one of said prediction modes is associated with a same list applicable to a syntax element being coded.

4. The method according to claim 1, wherein step (B) comprises the sub-step of:
   independently setting each of said first variables to said zero condition in response to said neighbor condition indicating that a corresponding one of said prediction modes is (i) a direct mode in a first case and (ii) said skip mode in a second case.

5. The method according to claim 1, wherein step (B) comprises the sub-step of:
   independently setting each of said first variables to said zero condition in response to said neighbor condition indicating that a corresponding one of said prediction modes does not use a pixel prediction from a same list applicable to a syntax element being coded.

6. The method according to claim 1, wherein each of said first variables comprise a conditioning term flag that describes a functional relationship between a spatially neighboring symbol and a value of said first variables.

7. The method according to claim 1, wherein each of said first variables comprises an absolute value motion vector difference component.

8. The method according to claim 1, wherein said coding comprises context adaptive binary arithmetic decoding.

9. The method according to claim 1, wherein said coding comprises context adaptive binary arithmetic encoding.

10. A system comprising:
    a first circuit configured to (i) evaluate a neighbor condition corresponding to a plurality of neighbor blocks to a current block in a bitstream of digital video, wherein (1) said neighbor condition comprises (a) a first of said neighbor blocks having an unavailable macroblock address, (b) a second of said neighbor blocks having an intra-prediction mode of a plurality of prediction modes, (c) a third of said neighbor blocks having a skip mode of said prediction modes and (d) a reference index zero flag having a non-zero condition, and (e) a prediction mode flag having a zero condition and (2) said prediction mode flag has said zero condition where (a) a fourth of said neighbor blocks is sub-partitioned and has a sub-macroblock prediction mode that is not an inter-prediction mode of said prediction modes and not a bi-directional prediction mode of said prediction modes and (b) a fifth of said neighbor blocks is unpartitioned and has a macroblock partition prediction mode that is not said inter-prediction mode and not said bi-directional prediction mode (ii) generate a plurality of first variables based on said evaluation and (iii) calculate a context index increment variable based on said first variables; and
    a second circuit configured to code said bitstream using a binary arithmetic coding based on a particular context among a plurality of context determined from said context index increment variable.

11. The system according to claim 10, wherein said first circuit is further configured to generate said context index increment variable based on a sum of two of said first variables.

12. The system according to claim 10, wherein said first circuit is further configured to independently set each of said first variables to said non-zero condition in response to said neighbor condition indicating that a corresponding one of said prediction modes is associated with a same list applicable to a syntax element being coded.

13. The system according to claim 10, wherein said first circuit is further configured to independently set each of said first variables to said zero condition in response to said neighbor condition indicating that a corresponding one of said prediction modes does not use a pixel prediction from a same list applicable to a syntax element being coded.

14. The system according to claim 10, wherein said neighbor blocks comprise a first neighbor block left of said current block and a second neighbor block above said current block.

15. The system according to claim 10, wherein said first circuit comprises a context modeling circuit.

16. The system according to claim 10, wherein said second circuit comprises one of a context adaptive binary arithmetic decoder and a context adaptive binary arithmetic encoder.

17. A system comprising:
means for (i) evaluating a neighbor condition corresponding to a plurality of neighbor blocks to a current block in a bitstream of digital video, wherein (1) said neighbor condition comprises (a) a first of said neighbor blocks having an unavailable macroblock address (b) a second of said neighbor blocks having an intra-prediction mode of a plurality of prediction modes, (c) a third of said neighbor blocks having a skip mode of said prediction modes and (d) a reference index zero flag having a non-zero condition, and (e) a prediction mode flag having a zero condition and (2) said prediction mode flag has said zero condition where (a) a fourth of said neighbor blocks is sub-partitioned and has a sub-macroblock prediction mode that is not an inter-prediction mode of said prediction modes and not a bi-directional prediction mode of said prediction modes and (b) a fifth of said neighbor blocks is unpartitioned and has a macroblock partition prediction mode that is not said inter-prediction mode and not said bi-directional prediction mode (ii) generating a plurality of first variables based on said neighbor condition and (iii) calculating a context index increment variable based on said first variables; and
means for coding said bitstream using a binary arithmetic coding based on a particular context among a plurality of context determined from said context index increment variable.

18. The method according to claim 6, wherein said conditioning term flag is used to code a reference picture index list type of syntax element.

19. The method according to claim 7, wherein said absolute value motion vector difference component is used to code a motion vector difference list type of syntax element.

20. The system according to claim 10, wherein said first circuit is further configured to independently set each of said first variables to said zero condition in response to said neighbor condition indicating that a corresponding one of said prediction modes is (i) a direct mode in a first case and (ii) said skip mode in a second case.

* * * * *